(12) United States Patent
Aspar et al.

(10) Patent No.: US 7,498,234 B2
(45) Date of Patent: Mar. 3, 2009

(54) METHOD OF PRODUCING A THIN LAYER OF SEMICONDUCTOR MATERIAL

(75) Inventors: Bernard Aspar, Rives (FR); Michel Bruel, Veurey (FR); Thierry Poumeyrol, Vaulnaveys-le-haut (FR)

(73) Assignee: Commissariat a l'Energie Atomique, Paris (FR)

( * ) Notice: Subject to any disclaimer, the term of this patent is extended or adjusted under 35 U.S.C. 154(b) by 125 days.

(21) Appl. No.: 11/327,906

(22) Filed: Jan. 9, 2006

(65) Prior Publication Data

US 2006/0115961 A1    Jun. 1, 2006

Related U.S. Application Data

(63) Continuation of application No. 10/784,601, filed on Feb. 23, 2004, now Pat. No. 7,067,396, which is a continuation of application No. 09/777,516, filed on Feb. 6, 2001, now Pat. No. 6,809,009, which is a continuation of application No. 08/856,275, filed on May 14, 1997, now Pat. No. 6,020,252, which is a continuation of application No. 09/299,683, filed on Apr. 26, 1999, now Pat. No. 6,225,192.

(30) Foreign Application Priority Data

May 15, 1996    (FR) .................................. 96 06086

(51) Int. Cl.
     *H01L 21/762* (2006.01)

(52) U.S. Cl. ..................... 438/455; 438/458; 438/459; 257/E21.569

(58) Field of Classification Search .......... 257/E21.569; 438/459, 977, 460, 455, 458, 406, FOR. 485; 148/DIG. 12

See application file for complete search history.

(56) References Cited

U.S. PATENT DOCUMENTS 4,179,324 A    12/1979   Kirkpatrick ................. 156/230

(Continued)

FOREIGN PATENT DOCUMENTS

EP    0355913    2/1990

(Continued)

OTHER PUBLICATIONS

EerNisse, E.P. et al, "Role of Integrated laterial stress In surface deformation of He-Implanted surfaces," Journal of Applied Physics, vol. 48, No. 1, Jan. 1997, pp. 9-17.
Roth, J., "Blistering and bubble formation," Inst. Phys. Conf. Ser., No. 28, 1976, pp. 280-293.
Ligeon, E. et al, "Hydrogen Implantation in Silicon Between 1.5 and 60 KeV," Radiation Effects, Col. 27, 1976, pp. 129-137.
Ascheron, C. et al, "Gettering a Copper In Proton- and Helium-Bombarded Buried Regions of Gallium Phosphide,". Phys. Stat. So. (a), 106, 73, 1988, pp. 73-79.

(Continued)

*Primary Examiner*—George Fourson
(74) *Attorney, Agent, or Firm*—Brinks Hofer Gilson & Lione

(57) ABSTRACT

The invention relates to a method of producing a thin layer of semiconductor material including:
  a step of implanting ions through a flat face (2) of a semiconductor wafer in order to create a layer of microcavities, the ion dose being within a specific range in order to avoid the formation of blisters on the flat face,
  a thermal treatment step in order to achieve coalescence of the microcavities
  possibly, a step of creating at least one electronic component (5) in the thin layer (6),
  a separation step of separating the thin layer (6) from the rest (7) of the wafer.

26 Claims, 2 Drawing Sheets

U.S. PATENT DOCUMENTS

Figure 1:
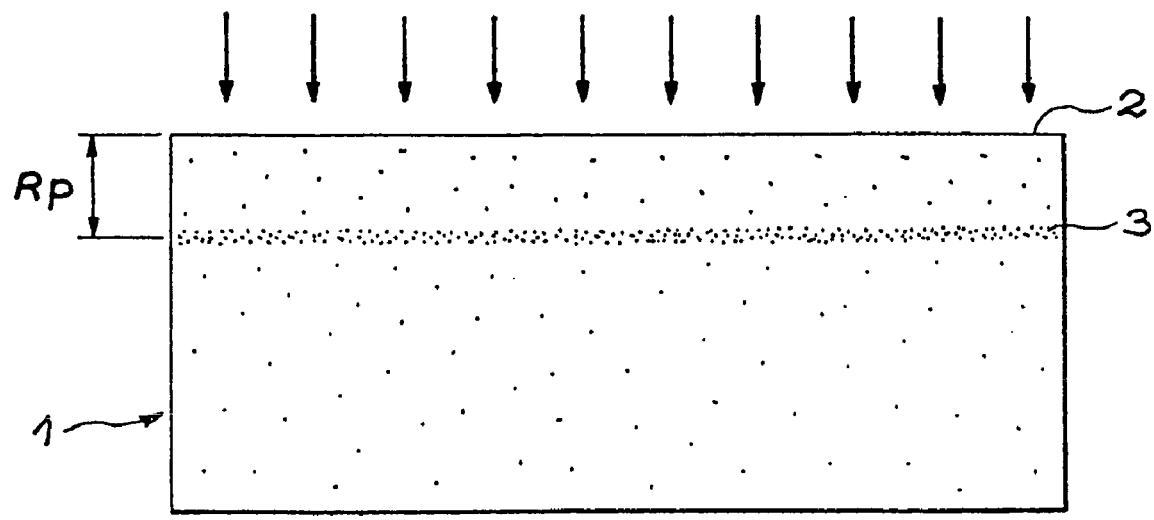

| | | | |
|---|---|---|---|
| 4,704,302 A | 11/1987 | Bruel et al. | |
| 4,931,405 A | 6/1990 | Kamijo et al. | 437/12 |
| 5,034,343 A | 7/1991 | Rouse et al. | 437/86 |
| 5,110,748 A | 5/1992 | Sarma | 437/51 |
| 5,198,371 A | 3/1993 | Li | 437/11 |
| 5,234,535 A | 8/1993 | NBeyer et al. | |
| 5,250,446 A | 10/1993 | Osowa et al. | |
| 5,256,581 A | 10/1993 | Foerstner et al. | 437/24 |
| 5,310,446 A | 5/1994 | Konishi et al. | 117/58 |
| 5,374,564 A * | 12/1994 | Bruel | 438/455 |
| 5,413,951 A | 5/1995 | Ohori et al. | 437/61 |
| 5,494,835 A * | 2/1996 | Bruel | 156/250 |
| 5,524,339 A | 6/1996 | Gorowitz et al. | 29/841 |
| 5,559,043 A | 9/1996 | Bruel | 437/24 |
| 5,567,654 A | 10/1996 | Beilstein, Jr. et al. | 437/209 |
| 5,618,739 A | 4/1997 | Takabashi et al. | 438/158 |
| 5,622,896 A | 4/1997 | Knotter et al. | 438/123 |
| 5,633,174 A | 5/1997 | Li | |
| 5,661,333 A | 8/1997 | Bruel et al. | 257/618 |
| 5,714,395 A * | 2/1998 | Bruel | 438/528 |
| 5,804,086 A * | 9/1998 | Bruel | 216/33 |
| 5,817,368 A | 10/1998 | Hashimoto | |
| 5,863,830 A * | 1/1999 | Bruel et al. | 438/478 |
| 5,863,832 A * | 1/1999 | Doyle et al. | 438/822 |
| 5,897,331 A | 4/1999 | Sopori | |
| 5,993,677 A * | 11/1999 | Biasse et al. | 216/36 |
| 6,020,252 A | 2/2000 | Aspar et al. | 438/458 |
| 6,048,411 A * | 4/2000 | Henley et al. | 148/33.5 |
| 6,225,192 B1 * | 5/2001 | Aspar et al. | |
| 6,294,478 B1 * | 9/2001 | Sakaguchi et al. | 438/753 |
| 2004/0029358 A1 * | 2/2004 | Park et al. | 438/458 |

FOREIGN PATENT DOCUMENTS

| | | |
|---|---|---|
| EP | 0504714 | 9/1992 |
| EP | 533551 A1 | 9/1992 |
| EP | 665588 A1 | 1/1995 |
| EP | 0 660 140 | 6/1995 |
| EP | 0703 609 | 3/1996 |
| EP | 703609 A1 | 3/1996 |
| FR | 2681472 | 9/1991 |
| FR | 2725074 | 3/1996 |
| GB | 2 211 991 | 7/1989 |
| JP | 53-104156 | 9/1978 |
| JP | 59-54217 | 3/1984 |
| SU | 1282757 | 12/1983 |
| WO | WO95/20824 | 8/1995 |

OTHER PUBLICATIONS

Ascheron, C. et al, "A comparative study of Swelling, Strain and Radiation damage of High-Energy Proton-Bombarded GaAS, GaP, InP, Si and Ge Single Crystals," Nuclear Instructions and Methods In Physics Research, B36, 1989, pp. 163-172.

Ascheron, C. et al, "Proton Beam Modification of Selected A-III B-v Compounds," Phys. Stat. Sol. (a), 124,11, 1991 pp. 10-55.

DiCioccio, et al., Silicon carbide on Insulator formation using the Smart Cut process, Electronics Letters, vol. 32, No. 12, Jun. 6, 1996, pp. 144-145.

Ascheron, C. et al, The Effect of Hydrogen Implantation Induced Stress on GaP Single Crystals, Nuclear Instruments & Methods In Physics Research, B28, 1987, pp. 350-359.

Bruel, Michel, "Application of hydrogen Ion beams to Silicon on Insulator material technology", Nuclear Instruments and Methods In Physics Research, B108, 1996, pp. 313-319.

Auberton-Herve, A.J. et al, "SOI Materials for ULSI Applications", Semiconductor International, Oct. 1995, 5 pps.

Cristoloveanu, S. et al, "Electrical Properties of Unibond Material", Electrochemical Society Proceedings, vol. 96-3, pp. 142-147.

Maleville, C. et al, "Physical Phenomena involved in the Smart-Cut Process", Electrochemical Society Proceeding, vol. 96-3, pp. 34-46.

Johnson, "High Fluence Deuteron Bombardment of Silicon", Radiation Effects, vol. 33, pp. 159-167.

Aspar, B. et al, "Characterization of SOI substrates: Application to Recent SIMOX and UNIBOND Wafers," Electrochemical Society Proceedings, vol. 96-3, pp. 99-111.

Bruel, M. et al, "Smart-Cut—a new SOI Material Technology based on hydrogen Implantation and wafer bonding," CEA 1996, 24 pages.

Bruel, M. et al, "Smart-Cut": A promising New SOI material technology, Proceedings 1999 IEEE, International SOI Conference, Oct. 1995, pp. 178-179.

Ascheron, et al, Swelling, Strain, and Radiation Damage of He+ Implanted GaP, Phys. Stat. Sol. (a) 96, pp. 555-562, 1986.

*Silicon-On-Insulator, European Semiconductor*, Mar. 1997, pp. 17 and 18.

Aspar et al., *Smart-Cut®: The basic fabrication process for UNIBOND® SOI wafers*, SEMI 1996, pp. 37-46.

Klem et al., *Characteristics of lift-off fabricated AlGaAs/InGaAs single-strained quantum well structures on glass and silicon substrates*, Inst. Phys. Conf., Ser. No. 96: Chapter 6, pp. 387-392.

Hamaguchi et al., *Device Layer Transfer Technique using Chemi-Mechnical Polishing*, Japanese Journal of Applied Physics, 23(1984), Oct., No. 10, Part 2, Tokyo, Japan, pp. L815-L817.

Haisma et al., *Silicon-on-Insulator Wafer Bonding-Wafer Thinning Technological Evaluations*, Japanese Journal of Applied Physics, 28(1989), Aug., No. 8, Part 1, Tokyo, Japan, pp. 1426-1443.

W.K. Chu, et al Radiation Damage of 50-250 keV Hydrogen Ions in Silicon, date unknown.

William Primak et al Impurity Effect in the Ionization Dilation of Vitreeous Silica 1967.

Errol P. Eernisse, Compaction of Ion-Implanted Fused Silica, 1973.

S.H. Wemple et al, Optical an d Channeling Studies of Ion-Bombarded GaP, 1973, pp. 1578-1588.

E.P. Eernisse et al., Role of Intergrated Lateral Stress in Surface Deformation of H-Implanted Surfaces, 1976, pp. 9-17.

J.H. Evans, An Interbubble Fracture Mechanism of Blister Formation on Helium-Trradiated Metals, 1977, pp. 129-140.

N..N. Gerasimenko et al, Infrared Absorption of Silicon Irrsdiated by Protons, 1978 pp. 689-695.

A.C. Greenwalrd et al, Pulse-Electron-Beam Annealing of Ion Implantation Damage, 1978 pp. 783-786.

H.C. Snyman et al, Viod Formation in Annealed Proton-BombardedGaAs, 1981, pp. 243-245.

S. Miyagawa et al, Helium Reemission During Implantation of Silicon Carbide, 1982, pp. 2302-2306.

A. Manuaba et al, Comparative Study of Fe32Ni36Cr14P12B6 Metallic Glass and Its Polycrystalline Modification Bombarded by 2000 keV Helium Ions With High Fluence 1982, pp. 409-419.

S. Miyagawa et al, Surfaces Structure of Silicon Carbide Irradiated With Helium Ions With Monoenergy and Continuous Energy Distributions, 1982, pp. 8697-8705.

H.C. Snyman et al, Transmission Electron Microscopy of Extended Crystal Defects in Proton Bombarded and Annealed GaAs, 1982, pp. 199-230.

D.R. Myers et al, The Effects of Ion-Implantation Damage on the First-Order Taman Spectra of GaPa, 1983, pp. 5032-5038.

F. Paszti et al, Flaking and Wave-Like Structure on Metallic Glasses Induced by MeV-Energy Helium Ions, 1983 pp. 273-280.

C. Ascheron et al, Proton Bombardment Induced Swelling of GaP, 1985, pp. 169-176.

C. Ascheron et al, Investigation of Hydrogen Implanted GaP Crystals, 1985, pp. 549-557.

J.H. Nethling et al, Identification of Hydrogen Platelets in Proton-Bombarded GaAs, 1985, pp. 941-945.

D. Stephan et al, Investigation of Lattice Strain in Proton-Irradiated GaP By A Modified Auleytner Technique, 1985, pp. 589-596.

J.C. Tzeng et al, A Novel Self-Aligned Oxygen (Salon) Implanted SOI MOSFET Device Structure, 1985, pp. 112-115.

IBM Technical Disclosure Bulletin, Isolation by Inert Ion Implantation, 1986, vol. 29 No. 3.

J. Haisma et al., Silicon-On-Insulator Wafer Boinding-Wafer Thinning Technological Evaluations, 1989, pp. 1426-1443.

Jianming Li, Novel Semiconductor Substrate Formed by Hydrogen Ion Implantation Into Silicon, 1989, pp. 2223-2224.

H. Moriceau et al, A New Characterization Process Used to Qualify SOI Films, 1991 pp. 173-178.

A.J. Auberton-Herve et al., SOI Materials for ULSI Application, 1995.

M. Bruel et al, "Smart-Cut": A Promising New SOI Material Technology, 1995, pp. 178-179.

M. Bruel et al., "Smart-Cut": A Promising New SOI Material Technology, 1995, pp. 178-179.

B. Aspar et al, Transfer of Structured and Patterned Thin Silicon Films Using the Smart-Cut Process, 1996, pp. 1985-1986.

A.J. Auberton-Herve et al, A New SOI Material: Smart-Cut, 1996, pp. 214-219.

Michel Bruel, Smart-Cut Process: The Way to Unibond S.O.I. Wafers, 1996, pages unknown.

Leti Outline-A New SOI Material Technology, 1996 (Author Unknown), pages unknown.

B. Aspar, Basic Mechanisms Involved in the Smart-Cut Process, 1997, pp. 223-240.

Michel Bruel et al., Smart-Cut: A New Silicon on Insulator Material Technology Based on Hydrogen Implantation and Wafer Bonding, 1997, pp. 1636-164, Col. 36, Part 1, No. 3B.

L. Di Cioccio et al, Silicon Carbide on Insulator Formation by the Samrt-Cut Process, 1997 pp. 349-356.

Christopher Maleville et al, Wafer Bonding and H-Implantation Mechanisms Involved in the Smart-Cut Technology, 1997, pp. 14-19.

H. Moriceau et al, The Smart-Cut Process as a Way to Chieve Specific Film Thickness in SOI Structures, 1997, pages unknown.

D. Munteanu et al, Detailed Characterization of Unibond Material, 1997, pp. 395-398.

Comparative study of annealed neon-, argon-, and krypton- ion Implantation damage In silicon, A.G. Cullis, T. E. Scidel and R.L. Meek, J. Appl. Phys. 49(10) Oct. 1978, pp. 5188-5198.

Equilibrium Shape of Si, Eaglesham, White, Feldman, Moriya nd Jacobson, Physical Review Letters, vol. 70, No. 11, Mar. 15, 1993, pp. 1643-1646.

La Formation Des Cloques, Saint-Jacques, Nuclear Instruments and Methods 209/210 (1983), pp. 333-343.

Hydrogen Interaction with phosphorus ion implantated silicon, Tonini, Monelli, Cornl, Ottaviani, Frabboni, Canteri, Queirolo, Ion Implantation Technology -94, pp. 801-804.

Infrared Spectroscopy of chemically bonded hydrogen at voids and defects in silicon, Stein, Myers and Follstaedt, J. Appl. Phys. 73(b6), Mar. 15, 1993, pp. 2755-2764.

Silicon-on-Insulator produced by helium Implantation and thermal oxidation, Raineri, Campisano, Appl. Phys. Lett. 66 (26), Jun. 26, 1995, pp. 3654-3656.

Radiative Recomination Channels due to Hydrogen In Crystalline Silicon, Canham, Dyball, Leong, Houlton, Cullis and Smith, Mterials Science and Engineering, B4 (1989) pp. 41-45.

Ion Implantation In Semiconductors 1976, Chernow, Borders and Brice, Pirnum Press, New York and London,Radiation Damage of 50-250 keV Hydrogen Ions in Silicon, Chu, Kastle, Lever, Mader and Masters, S, pp. 483-491.

"Silicon on insulator Material Technology" Bruel, M. Electronic Letters; 31 (1995) Jul. 6; No. 14; pp. 1201-1202.

"Investigation of the Bubble Formation Mechanism in a-Si:H films by Fourier-transform infrared microspectroscopy" Mishima et al. Japan Allied Physics; 64(8); Oct. 15, 1988; pp. 3972-3974.

Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods in Physics Research" Nuclear Instruments and Methods In Physics Research B36(1989) 163?172.

Ascheron, C., "A Study of Proton Bombardment Induced Swelling of GaP Single Crystals" phys. stat. sol. (a) 92, 169 (1985).

Ascheron, C., "Gettering of Copper in Proton-and Helium-Bombarded Buried Regions of Gallium Phosphide" phys. stat. sol. (a) 106, 73 (1988).

Ascheron, C., "Investigations of Hydrogen Implanted GaP Single Crystals by Means of Particle Induced ?-Spectroscopy, Infrared Spectroscopy, and Turyherford Backscattering Channeling Technique" phys. stat. sol. (a) 89, 549 (1985).

Ascheron, C., "Proton Beam Modification of Selected AIIIBV Compounds" phys. stat. sol. (a) 124, 11 (1991).

Ascheron, C., "Swelling, Strain, and Radiation Damage of He+ Implanted GaP" phys. stat. sol. (a) 96, 555 (1986).

Asheron, C., "The Effect of Hydrogen Implantation Induced Stress on GaP Single Crystals" Nuclear Instruments and Methods in Physics Research B28 (1987) 350-359.

Bruel, M., "Silicon-On-Insulator" European Semiconductor, Mar. 1997.

Cassidy, Victor M., "Ion Implantation Process Toughens Metalworking Tools," Modern Metals, pp. 65-67, 1984.

Chu et al, "Radiation Damage of 50-250 keV Hydrogen Ions in Silicon", Ion Implantation in Semiconductors, eds. F. Chernob et al., Plenum New York 1976, pp. 483-492.

Chu, P.K. et al., Plasma Immersion Ion Implantation-A Fledgling Technique for Semiconductor Processing, Materials Science and Engineering Reports: A Review Journal, pp. 207-280, vol. R17, Nos. 6-7, Nov. 30, 1996.

Chu, Kastle, Lever, Mader and Masters, S, Radiative Recombination Channels due to Hydrogen in Crystalline Silicon, Canham, Dyball Leong, Houlton, Cullis and Smith, Materials Science and Engineering, B4 (1989), pp. 41-45. Ion Implantation in Semiconductors 1976, Chernow, Borders and Brice, Pirnum Press, New York and London, Radiation Damage of 50-250 keV Hydrogen Ions in Silicon,, pp. 483-391.

Cullis, A.G.,T.E. Seidel and R.L. Meek, "Comparative study of annealed neon-, argon-, and krypton-ion implantation damage in silicon," J. Appl. Phys., 49(10), pp. 5188-5198, Oct. 1978.

EerNisse, E., "Compaction of ion-implanted fused silica" Journal of Applied Physics, vol. 45, No. 1, Jan. 1974.

EerNisse, E.P., "Role of Integrated Lateral Stress In Surface Deformation of He- Implanted Surfaces" Journal of Applied Physics, vol. 48, No. 1, Jan. 1977.

Evans, J.H., "An Interbubble Fracture Mechanism Of Blister Formation On Helium-Irradiated Metals" Journal of Nuclear Materials 68(1977) 129-140.

Menko, N., "Infrared Absorption of Silicon Irradiated by Protons" phys. stat.sol. (b) 90, 689 (1978).

Gerasimenko, N., "Infrared Absorption of Silicon Irradiated by Protons" phys. stat.sol. (b) 90, 689 (1978).

Greenwald, A.C., "Pulsed-electron-beam annealing of ion-implantation damage" J. Appl. Phys. 50(2), Feb. 1978.

Grovenor, C.R.M., Microelectronic Materials, pp. 73-75 (1989).

Haisma et al., Silicon-on-Insulator Wafer Bonding-Wafer Thinning Technological Evaluations, Japanese Journal of Applied Physics, 28(1989), Aug., No. 8, Part 1, Tokyo, Japan, pp. 1426-1443.

Hamaguchi et al., Device Layer Transfer Technique using Chemi-Mechanical Polishing, Japanese Journal of Applied Physics, 23(1984), Oct., No. 10, Part 2, Tokyo, Japan, pp. L815-L817.

Helium Bubble and Blister Formation for Nickel and An AMorphous Fe-Ni-Mo-B Alloy During 5 kev He+-Irradiation at Temperatures Between 200 K and 600 K, Swijgenhoven, Stals and Knuyt, Nuclear Instruments and Methods 209/210 (1983) pp. 461-468.

Hulett, D.M. et al., "Ion Nitriding and Ion Implantation: A Comparison," Metal Progress, pp. 18-21, 1985.

Japan Applied Physics; 64(8); Oct. 15, 1988; pp. 3972-3974.

Johnson, P.B., "High Fluence Deuteron Bombardment of Silicon" Radiation Effect 1977, vol. 32 pp. 159-167.

"Isolation by Inert Ion Implantation" IBM Technical Disclosure Bulletin vol. 29, No. 3, Aug. 1986, p. 1416.

Klem, J.F., Characteristics of Lift-Off Fabricated AIGaAs/InGaAs Single-Strained-Quantum Well Structures On Glass and Silicon Substrates, Inst. Phys. Conf. Ser. No. 96: Chapter 6, pp. 387-392 (1989).

Li, J., "Novel Semiconductor Substrate Formed by Hydrogen Ion Implantation into Silicon," Appl. Phys. Lett., vol. 55, No. 21, pp. 2223-2224, Nov. 20, 1989.

Ligeon, E., "Hydrogen Implantation in Silicon Between 1.5 and 60 KeV" Radiation Effects 1976, vol. 27, pp. 129-137.

Manuaba, A., "Comparative Study on Fe32Ni36Cr14P12B 6 Metallic Glass and its Polycrystalline Modification bombarded by 2000 keV Helium Ions with High Fluence" Nuclear Instruments and Methods 199 (1982) 409-419.

Matsuda et al., "Large Diameter Ion Beam Implantation System," Nuclear Instruments and Methods, vol. B21, pp. 314-316, 1987.

Mishima, Y. and T. Yagishita, T. "Investigation of the bubble formation mechanism in a-Si:H films by Fourier-transform infrared microspectroscopy" J. Appl. Phys., vol. 64, No. 8, Oct. 15, 1988.

Miyagawa, S., "Helium remission during implantation of silicon carbide" J. Appl. Phys. 54 (5), May 1983.

Miyagawa, S., "Surface structure of silicon carbide Irradiated with helium ions with monoenergy and continuous energy distributions" J. Appl. Phys. 53(12), Dec. 1982, pp. 8697-8705.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Myers, D. R., The effects of Ion-Implantation damage on the first-order Raman spectra GaPa) J. Appl. Phys. 54(9), Sep. 19??.

Neethling, J.H. et al. Identification of Hydrogen Platelets in Proton-Bombarded GaAs, 1985, pp. 941?-945.

Paszti, F., "Flaking and Wave-Like Structure on Metallic Glasses Induced by MeV-Energy Helium Ions" Nuclear Instruments and Methods 209/210(1983) 273-280.

Picraux, S. Thomas et al., "Ion Implantation of Surfaces," Scientific American, vol. 252, No. 3, pp. 102-113 1985.

Primak, W., "Impurity Effect in the Ionization Dilation of Vitreous Silica" J. Appl. Phys. 39(13) 1968.

Renier, M. et al., "A New Low-Energy Ion Implanter for Bombardment of Cylindrical Surfaces," Vacuum, vol. 35, No. 12, pp. 577-578, 1985.

Roth, J., "Blistering and Bubble Formation" Inst. Phys. Conf. Ser. No. 28 © 1976: Chapter 7.

Sah, Chih-Tang et al., "Deactivation of the Boron Acceptor in Silicon by Hydrogen," Appl. Phys. Lett. 43(2), Jul. 1983, pp. 204-206.

Sioshansi, Piran, "Ion Beam Modification of Materials for Industry," Thin Solid Film, vol. 118, pp. 61-71, 1984.

Snyman, H. C., "Transmission Electron Microscopy of Extended Crystal Defects in Proton Bombarded and Annealed GaAs" Radiation Effects, 1983, vol. 69, pp. 199-230.

Snyman, H. C., "Void formation in annealed proton-bombarded GaAs."

Stephen, D., "Investigation of Lattice Strain in Proton-Irradiated GaP by a Modified Auleytner Technique" phys. stat. sol. (a) 87, pp. 589-596 (1985).

Sze, S.M., VLSI Technology, 2.sup.nd Ed., pp. 9-10 (1988).

Tzeng, J.C., "A Novel Self-Aligned Oxgyen (Salox) Implanted SOI Mosfet Device Structure" Nuclear Instruments and Methods in Physics Research B2, pp. 112-115 (1987).

U.S. Dept. of Energy, "The Fusion Connection: . . .", Plasma Coating, pp. 6-7, 1985.

Veldkamp, W.B. et al., "Binary Optics," Scientific American, pp. 50-55, May 1992.

Wemple, S.H., "Optical and channeling studies of ion-bombarded GaP" J. Appl. Phys., vol. 45, No. 4, Apr. 1974.

Wolf, Stanley Ph.D., Silicon Processing for the VLSI Era (vol. 2), pp. 66-79, Lattice Press, 1990.

"Hydrogen-Related Complexes as the Stressing Species in High-Fluence, Hydrogen-Implanted, Single-Crystal Silicon" Cerofolini et al., *Physical Review B*, vol. 46, No. 4, 1992, pp. 2061-2070.

"Crystallographic Nature and Formation Mechanisms of Highly Irregular Structure in Implanted and Annealed SI Layers" Komarov et al., *Radiation Effects*, vol. 42, 1979, pp. 169-178.

"Observation of Blistering and Amorphization on Germanium Surface After 450 keV Ar+ION Bombardment" Kamada et al, *Radiation Effects*, vol. 28, 1976, pp. 43-48.

"Orientation Dependence of Flaking of Ion Irradiated Aluminum Single Crystals" Ono et al., *Japanese Journal of Applied Physics*, vol. 25, No., 10, 1986, pp. 1475-1480.

"High Fluence Retention of Noble Gases Implanted in Silicon" Wittmaack et al., *Radiation Effects*, vol. 39, 1978, pp. 81-95.

"Applications of Ion Beams to Materials, 1975" Carter et al., Inst. Phys. Conf. Ser. No. 28, Capter 1, 1976, pp. 30-36.

Reissue U.S. Appl. No. 10/449,786.

* cited by examiner

METHOD OF PRODUCING A THIN LAYER OF SEMICONDUCTOR MATERIAL

This application is a continuation of prior U.S. application Ser. No. 10/784,601, filed Feb. 23, 2004, now U.S. Pat. No. 7,067,396, which in turn is a continuation of prior U.S. application Ser. No. 09/777,516, filed Feb. 6, 2001, now U.S. Pat. No. 6,809,009, which in turn is a continuation of prior U.S. application Ser. No. 09/299,683 filed Apr. 26, 1999, now U.S. Pat. No. 6,225,192, granted issue date May 1, 2001, which in turn is a continuation of U.S. application Ser. No. 08/856,275 filed May 14, 1997, now U.S. Pat. No. 6,020,252, granted Feb. 1, 2000.

This invention relates to a method of producing a thin layer of semiconductor material. The thin layer produced can possibly be provided with electronic components.

The invention permits the production of thin layers of either monocrystalline or polycrystalline or even amorphous semiconductor and, for example the production of substrates of the Silicon on Insulator type or the production of self-supporting thin layers of monocrystalline semiconductor. Electronic circuits and/or microstructures can be either completely or in part created in these layers or in these substrates.

It is known that implanting ions of a rare gas or of hydrogen in a semiconductor material induces the formation of microcavities at a depth proximate to the mean penetration depth of the ions. The document FR-A-2 681 472 discloses a method which uses this property in order to obtain a thin film of semiconductor. This method consists of subjecting a wafer of the desired semiconductor material that includes a flat face, to the following steps:

a first implantation step by bombarding the flat face of the wafer with ions creating, within the volume of the wafer and at a depth proximate to the penetration depth of the ions, a layer of microcavities separating the wafer into a lower region constituting the mass of the substrate and an upper region constituting the thin film, the ions being chosen from among the ions of rare gases or of hydrogen gas and the temperature of the wafer being maintained below the temperature at which the implanted ions can escape from the semiconductor by diffusion;

a second step of bringing the flat face of the wafer into close contact with a support made up of at least one layer of rigid material. This close contact may be created, for example using an adhesive substance, or by the effect of a preliminary preparation of the surfaces and possibly a thermal and/or electrostatic treatment in order to promote interatomic bonding between the support and the wafer;

a third step of thermal treatment of the wafer-support assembly at a temperature greater than the temperature at which the implantation was carried out and sufficient to create, through a crystal rearrangement effect in the wafer and through the pressure of the microcavities, a separation between the thin film and the mass of the substrate. This temperature is, for example 500° C. for silicon.

This implantation is capable of creating a layer of gaseous microbubbles. This layer of microbubbles thus created within the volume of the wafer; at a depth proximate to the mean penetration depth of the ions demarcates, within the volume of the wafer, two regions separated by this layer: one region intended to constitute the thin film and one region forming the rest of the substrate.

According to the implantation conditions, after implantation of a gas, such as, for example hydrogen, cavities or microbubbles may or may not be observable by transmission electronic microscopy. In the case of silicon, it can be obtained microcavities, the size of which can vary from a few nm to several hundreds of nm. Hence, particularly when the implantation temperature is low, these cavities are only observable during the thermal treatment stage, a step during which nucleation is brought about in order to end up with the coalescence of the microcavities at the end of the thermal treatment.

The method described in the document FR-A-2 681 472 does not allow the production of electronic circuits in or at the surface of the flat face of the wafer after the ion implantation step. Indeed, the creation of such circuits implies the carrying out of certain classic micro-electronics operations (diffusion annealing, deposition etc.) that require thermal treatment stages (typically from 400° C. to 700° C.) according to the steps for silicon. At these temperatures, blisters form on the surface of the flat face of the implanted wafer. By way of example, for an implantation of hydrogen ions at a dose of $5.10^{16}$ protons/cm$^2$ and at 100 keV energy in a silicon wafer, a thermal treatment carried out at 500° C. for 30 min. leads to degradation of 50% of the surface of the flat face of the wafer, this degradation resulting in the appearance of blisters and to their bursting. It is then no longer possible to properly ensure that the flat face of the wafer is brought into close contact with the support (which will be called the applicator in the subsequent description) so as to detach the semiconductor layer from the rest of the wafer.

This phenomenon of the formation of blisters and craters in the surface of a silicon wafer implanted with hydrogen ions after annealing has been discussed in the article "Investigation of the bubble formation mechanism in a-Si:H films by Fourier-transform infrared microspectroscopy" by Y. Mishima and T. Yagishita, that appeared in the J. Appl. Phys. 64 (8), 15th Oct. 1988, pages 3972-3974.

This invention has been conceived in order to improve the method described in the document FR-A-2 681 472. After a step of ion implantation within a range of appropriate doses and before the separation step, it allows to carry out a thermal treatment of the part of the wafer corresponding to the future thin layer, in particular between 400° C. and 700° C. for silicon, without degrading the surface condition of the flat face of the wafer and without separation of the thin layer. This intermediate thermal treatment can form part of the operations for developing electronic components or can be applied for other reasons.

The invention is also applicable in the case where the thickness of the thin layer is sufficient to confer good mechanical characteristics on it, in which case it is not necessary to use an applicator in order to achieve the separation of the thin layer from the rest of the wafer, but where it is desired, despite everything, to avoid surface defects in the flat face.

Therefore an objective of the invention is a method of production of a thin layer of semiconductor material from a wafer of said material having a flat face, including an ion implantation step consisting of bombarding said flat face with ions chosen from among the ions of rare gases or of hydrogen, at a specific temperature and a specific dose in order to create, in a plane called a reference plane and situated at a depth proximate to the mean depth of penetration of the ions, microcavities, the method also including a subsequent thermal treatment step at a temperature sufficient to achieve separation of the wafer into two parts, across the reference plane, the part situated on the side of the flat face constituting the thin layer, characterised in that:

the ion implantation step is carried out with an ion dose between a minimum dose and a maximum dose, the minimum dose being that from which there will be sufficient creation of microcavities to obtain the embrittlement of the wafer along the reference plane, the maximum dose, or critical dose being that above which, during the thermal treatment step, there is separation of the wafer, a separation step of separating the wafer into two parts, across the reference plane, is provided after or during the thermal treatment step, this separation step comprising the application of mechanical forces between the two parts of the wafer.

These mechanical forces can be tensile forces, shear forces or bending forces applied alone or in combination.

In the application, by microcavities, one understands cavities that can be of any form; for example, the cavities can be of a flat shape, that is to say of small height (a few interatomic distances) or of substantially spherical shape or any other different shape. These cavities can contain a free gaseous phase and/or atoms of gas arising from the implanted ions fixed to atoms of the material forming the walls of the cavities. In Anglo-Saxon terminology, these cavities are generally called "platelets", "microblisters" or even "bubbles".

The thermal treatment carried out with the purpose of achieving separation of the thin layer from the rest of the wafer, allows the microcavities to be brought to a stable state. Indeed, under the effect of temperature, the microcavities coalesce to reach a final definitive condition. Hence, the temperature is chosen in such a way that this condition is obtained.

According to document FR-A-2 681 472, the doses implanted are such that, under the effect of the thermal treatment, a layer of microcavities is obtained that allows the separation to be achieved directly.

According to this invention, the doses implanted are insufficient to achieve a separation during the thermal treatment, the doses implanted only allow an embrittlement of the wafer at the reference plane, the separation requires an extra step of applying mechanical forces. Furthermore, the critical dose, as defined in the invention, is less than the dose at which during the ion implantation and thermal treatment steps, there is blister formation on the flat face of the wafer. The problem of blisters does not therefore arise in the invention.

The method according to the invention can include, between the thermal treatment step and the separation step, a step consisting of producing all or part of at least one electronic component in the part of the wafer before forming the thin layer.

If the production of this electronic component requires phases of heat treatment, these are preferably carried out at a temperature below that of the thermal treatment.

If needed, just before the separation step, an extra step is provided, consisting of bringing said wafer, on the side of said flat face, into close contact with and rigidly fixing it to a support through which mechanical forces such as tensile and/or shearing forces will be applied.

This support can be a flexible support, for example a sheet of Kapton®. It can also be a rigid support such as a wafer of oxidised silicon.

Figure 2:
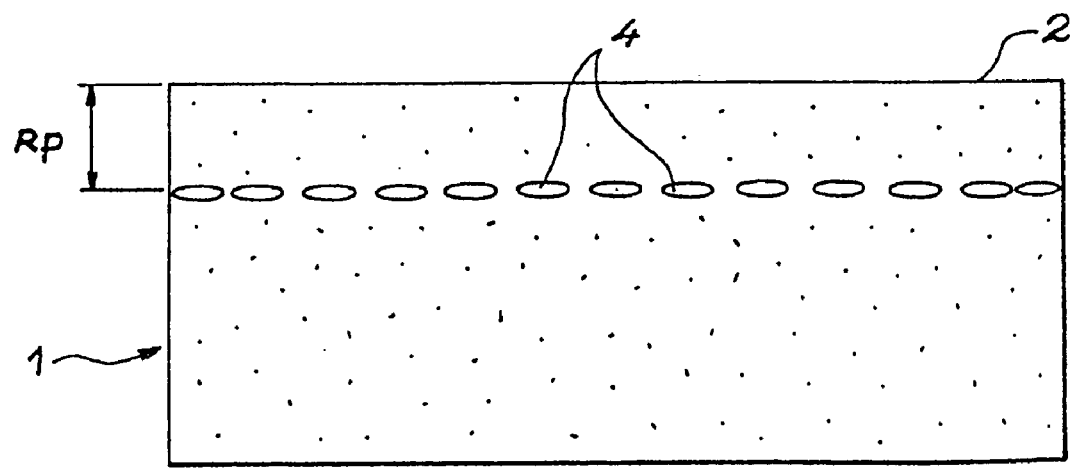
Figure 3:
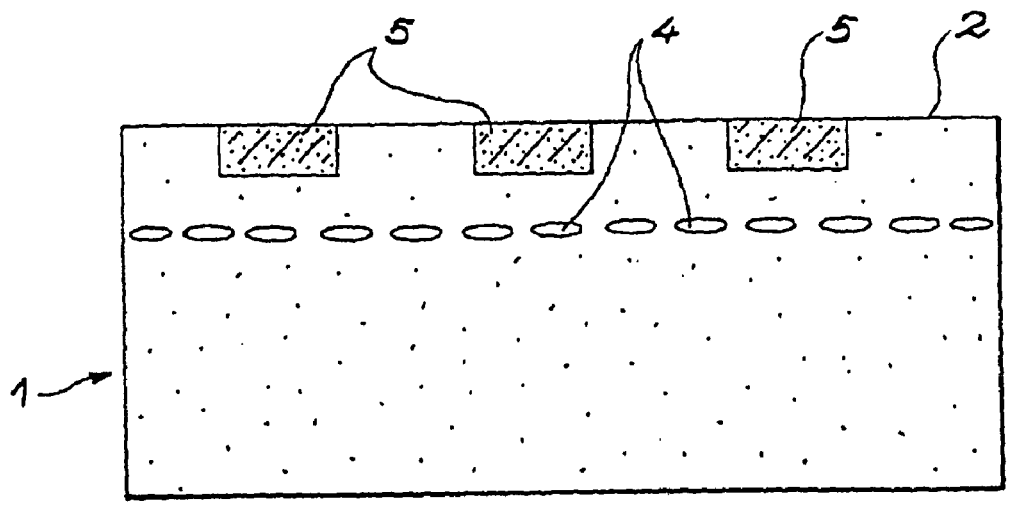
Figure 4:
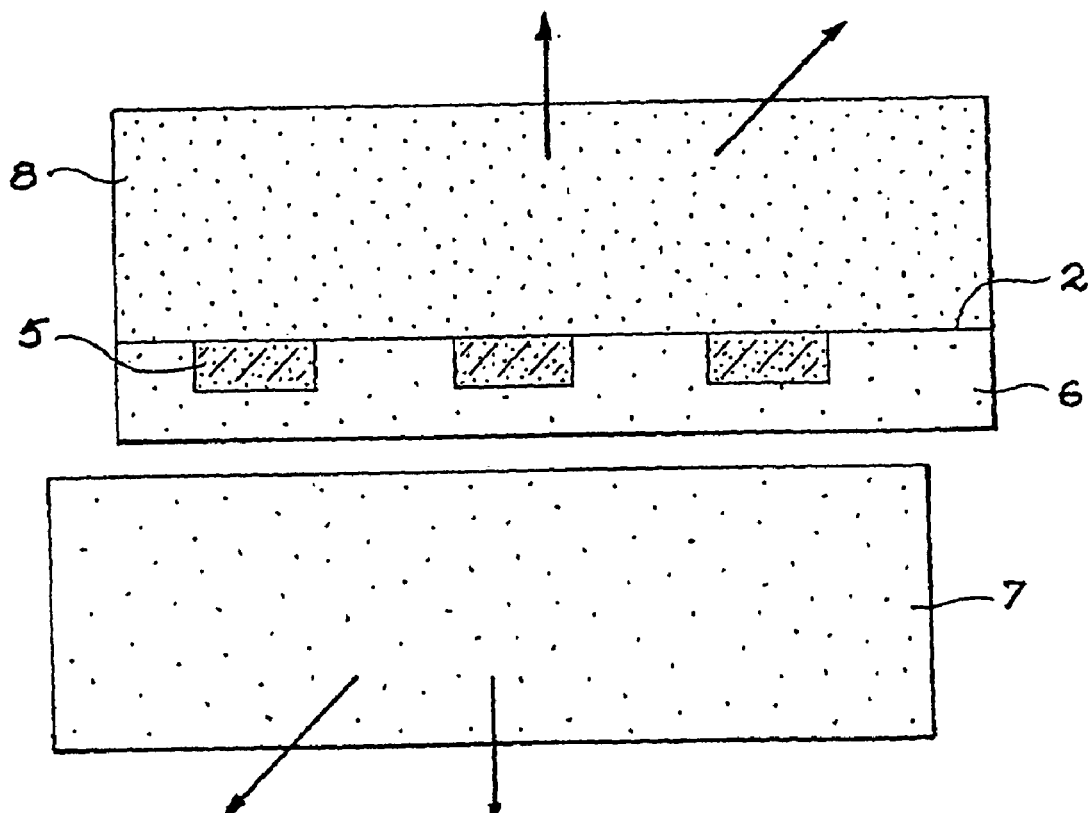

The invention will be better understood and other advantages and features will become apparent on reading the description that follows, giving by way of a non-limitative example, in which:

FIG. 1 represents diagrammatically a wafer of semiconductor material, one face of which is being subjected to ion bombardment in application of the method according to this invention, FIG. 2 represents diagrammatically the preceding wafer, at the end of the thermal treatment step intended to cause the microcavities to coalesce, according to this invention, FIG. 3 represents diagrammatically the preceding wafer, after formation of electronic components in the part corresponding to the desired thin layer, FIG. 4 represents diagrammatically the step of separating the preceding wafer into two parts, in accordance with this invention.

An important feature of this invention lies in the implantation of hydrogen or rare gas ions at a dose less than or equal to the dose above which there would be separation during the thermal treatment. The dose used is such that it permits embrittlement of the material at a depth $R_p$ corresponding to the mean distance travelled by the ions in the material, but the wafer remains sufficiently mechanically resistant to support all the thermal treatment steps necessary to produce the electronic circuits. In other terms, the implanted wafer has, in the area of the microcavities, solid bridges linking the part of the wafer designed to form the thin layer and the remaining part of the wafer.

The description is now going to be directed to the production of a thin layer of semiconductor material from a thick substrate having a flat face. The starting substrate may or may not be covered on this flat face with one or several layers of materials, such as, for example, encapsulating materials such as a dielectric.

FIG. 1 illustrates the ion implantation step of a wafer 1 of semiconductor material. The flat face 2 of the wafer receives the ionic bombardment represented by arrows. In the case where the flat face 2 of the wafer is covered with one or several non-semiconductor materials, the energy of the ions is chosen to be sufficient for them to penetrate into the mass of semiconductor material.

If the case arises, the thickness of the implanted semiconductor material must be such that all or part of electronic components and/or microstructures can be produced in the thin layer. By way of example, the mean penetration of hydrogen ions is 2 µm at 200 keV in silicon.

The ion implantation of these types of ions into the semiconductor substrate creates, at a depth proximate to the depth corresponding to the mean distance $R_p$ travelled by the ions along a perpendicular to the flat face, an area 3 with a high concentration of atoms giving rise to microcavities. For example, the maximum concentration of hydrogen is $10^{21}$ $H^+/cm^3$ for an implantation dose of $2.10^{16}$ $H^+/cm^2$ at 100 keV. This ion implantation step must be carried out at a temperature such that the implanted gas ions do not diffuse any great distance as the implantation step goes along. This would interfere with or ruin the formation of microcavities. For example, in the case of an implantation of hydrogen ions in silicon, the implantation will be carried out at a temperature below 350° C.

The implantation dose (number of ions received per unit surface area during the implantation period) is chosen in such a way that the dose is less than or equal to a dose, called the critical dose, such that, above this critical dose, during the subsequent thermal treatment step, there is separation of the thin layer from the rest of the wafer. In the case of implantation of hydrogen ions, this critical dose is of the order of $4.10^{16}$ $H^+/cm^2$ for an energy of 160 keV.

The implantation dose is also chosen to be greater than a minimum dose from which during the subsequent thermal treatment step, the formation of microcavities and the interaction between them is sufficient, that is to say it permits the embrittlement of the implanted material in the area of the microcavities 3. This means that solid bridges of semiconductor material still exist between the microcavities. In the case of an implantation of ions of hydrogen gas into a silicon substrate, this minimum dose is of the order of $1.10^{16}/cm^2$ at an energy of 100 keV.

The following step of the method according to the invention consists of a thermal treatment of the wafer at a temperature that is sufficient to allow coalescence of the microcavities along the reference plane. In the case of an implantation, at a temperature below 350° C., of ions of hydrogen gas into a silicon substrate and a dose of $3.10^{16}$ H$^+$/cm$^2$ at an energy of 100 keV, after a thermal treatment of thirty minutes at 550° C., it is observed by transmission electronic microscopy in section, cavities of height equal to a few fractions of nanometers and with an extension, along the reference plane of several nanometers or indeed several tens of nanometers. This thermal treatment permits, at the same time, the precipitation and then stabilisation of the atoms of implanted gas in the form of microcavities.

The microcavities 4 (see FIG. 2) occupy, along the reference plane, a surface area approximately equal to the surface area implanted. The cavities are not situated exactly in the same plane. They are in planes parallel to the reference plane, some nanometers or tens of nanometers from this reference plane. For this reason, the upper part of the substrate situated between the reference plane and the flat face 2 is not totally separated from the body of the substrate, the body of the substrate being defined as the rest of the substrate between the reference plane and the faces of the substrate other than the flat face. The remaining bonds are sufficiently strong to support the steps of manipulation and of annealing brought about by the technological steps taken in the creation of the integrated circuits. However, the bond between the upper part and the mass of the substrate is very much weakened since this bond is only made through bridges of semiconductor material situated between the cavities.

All or a part of electronic components, circuits and microstructures can then be created on the flat face 2 (at the surface or under the surface).

The ion implantation energy of the hydrogen or rare gas ions in the first step has been chosen in such a way that the depth of the area of microcavities is sufficient for it not to be disturbed by the creation of components, electronic circuits and/or microstructures during this step. Furthermore, the whole of the thermal annealing operations that the development of electronic circuits or microstructures requires, is chosen in such a way that possible diffusion of the implanted ions is minimised. For example, in the case of a wafer of monocrystalline silicon, the maximum temperature of the various phases of the method will be limited to 900° C.

FIG. 3 illustrates the case where several electronic components, reference number 5, have been developed on the flat face 2 and in the part of the wafer intended to form the thin layer.

The separation step then follows. It consists of applying separating mechanical forces, for example, tensile forces between the parts of the wafer or substrate situated on each side of the reference plane in a manner that fractures the remaining solid bridges. This operation allows to obtain the thin layer of semiconductor material fitted with electronic components in the case described. FIG. 4 illustrates this separation step in the course of which the thin layer 6 is separated from the remaining mass 7 of the substrate by the action of forces acting in the opposite direction and represented by the arrows.

Experience shows that the tensile stress necessary to separate the upper part of the body of the substrate is low particularly when a shearing stress is applied between the upper part and the body of the substrate, that is to say when the stresses applied have a component applied along the reference plane. This is simply explained by the fact that the shear stress promotes the propagation of fractures and cavities within the reference plane.

The upper part of the substrate, being by nature thin, the tensile stress and/or the shear stress cannot in most cases be comfortably applied directly to it. It is then preferable, before the separation step, to make the wafer, via its flat face 2, integral with a support or applicator through which the mechanical forces will be applied to the upper part of the wafer. This applicator is represented in FIG. 4 under reference number 8.

The applicator can be a rigid or a flexible support. By the term rigidly fixing the applicator onto the wafer, one understands here any sticking operation or operation of preparing the surfaces and bringing them into contact that allows sufficient bonding energy to be provided between the applicator and the flat face of the wafer to resist the tensile and/or shear and/or bending process(es) of the separation step.

The applicator can be, for example, a sheet of plastic material such as Kapton® which has been made adherent to the flat face of the substrate. In this example, after application of the method according to the invention, a thin layer of monocrystalline semiconductor on a sheet of Kapton® is obtained.

So as to properly transmit the stresses to the whole of the upper thin layer, the circuits created in and at the surface of the upper layer can have been covered with a protective layer, possibly making it flat, during the step of developing the electronic components. The applicator is then rigidly fixed to the upper thin layer of the wafer through this protective layer.

The applicator may also be a rigid support, for example a silicon wafer, the surface of which has been covered with a dielectric layer. An appropriate physico-chemical treatment is, for example, carried out on the flat face of the wafer and/or the surface of the applicator (carrying a dielectric layer or not) so that bringing them into contact, possibly associated with a heat treatment, rigidly fixes the flat face of the wafer and the applicator together.

In the case mentioned as an example where the applicator is a silicon wafer carrying a layer of oxide on its surface and where the semiconductor substrate is a wafer of monocrystalline silicon, after application of the method according to the invention, a wafer of silicon on insulator is obtained where the surface layer of silicon is the fine layer provided by the upper part of the substrate.

Furthermore, after separation of the thin layer from the rest of the wafer, the free face of this layer can allow the further repeat use of a substrate that can be fitted with electronic components produced completely or partially on the substrate. Such a stacking allows a "three dimensional" assembly of electronic circuits, the stiffener itself possibly including electronic components.

The invention claimed is:

1. A method for producing a thin film comprising:
    providing a first substrate having a face surface;
    introducing ions into the first substrate at the face surface, such that microcavities are formed in the first substrate during or after introducing the ions, wherein the microcavities define a thin film layer extending from the face surface to the microcavities, wherein the microcavities reside between solid bridges of the first substrate;
    bonding a second substrate to the face surface of the first substrate; and
    applying mechanical force to the thin layer through the second substrate to fracture the solid bridges.

2. The method of claim 1, wherein applying mechanical force to the thin layer comprises applying a mechanical force to the second substrate selected from the group consisting of tensile force, shear force, bending forces, and combinations thereof.

3. The method of claim 1, wherein applying mechanical force to the thin layer comprises applying a shear force to the second substrate.

4. The method of claim 1, wherein applying mechanical force to the thin layer comprises applying a tensile force to the second substrate.

5. The method of claim 1, further comprising applying mechanical force to the first substrate.

6. The method of claim 5, wherein applying mechanical force to the first substrate comprises applying mechanical force to the first substrate in an opposite direction from the mechanical force applied to thin layer.

7. The method of claim 5, wherein applying mechanical force to the thin layer comprises applying a shear stress to the solid bridges and a tensile stress between the first and second substrates.

8. The method of claim 1, wherein providing a first substrate having a face surface comprises providing a first substrate having one or more layers of materials on the face surface.

9. The method of claim 8, wherein the one or more layers of materials comprises a dielectric layer.

10. The method of claim 1, wherein bonding a second substrate to the face surface of the first substrate comprises bonding a silicon substrate having a dielectric layer thereon.

11. A method for producing a thin film comprising:
providing a first substrate having a face surface;
introducing ions into the first substrate at the face surface, such that microcavities are formed in the first substrate during or after introducing the ions, wherein the microcavities define a thin film layer extending from the face surface to the microcavities, wherein the microcavities reside between solid bridges of the first substrate;
thermally treating the first substrate to coalesce the microcavities;
bonding a second substrate to the face surface of the first substrate; and
applying mechanical forces to fracture the solid bridges.

12. The method of claim 11, wherein introducing ions into the first substrate comprises maintaining the temperature of the first substrate at a temperature below the diffusion temperature of the ions in the first substrate.

13. The method of claim 10, wherein bonding a second substrate to the face surface of the first substrate comprises creating a bonding energy between the first and second substrates sufficient to resist the mechanical forces applied to fracture the solid bridges.

14. The method of claim 10, further comprising applying a physicochemical treatment to one or both of the face surface and a bonding surface of the second substrate prior to bonding the second substrate to the face surface of the first substrate.

15. A thin film comprising a thin layer of semiconductor material on a substrate, wherein the thin layer is defined by an interface between the thin layer and the substrate opposite from a cleaved surface, wherein the cleaved surface comprises microcavities residing between fractured regions of semiconductor material.

16. The thin film of claim 15, further comprising a dielectric layer on the substrate and wherein the interface is defined by an interface between the thin layer and the dielectric layer.

17. The thin film of claim 15, further comprising an electronic component in the thin layer in proximity to the interface between the thin layer and the substrate.

18. The thin film of claim 15, wherein the substrate comprises a plastic material.

19. The thin film of claim 15, wherein the substrate comprises a semiconductor material.

20. The thin film of claim 15, wherein the substrate comprises silicon.

21. A method for producing a thin film comprising the steps of:
implanting hydrogen ions into a semiconductor material substrate through a face thereof so as to form a layer of microcavities with bridges connecting a thin film layer of desired thickness to a remaining portion of the semiconductor material substrate, the quantity of ions in the layer of microcavities being insufficient to produce fracture of the bridges throughout the layer of microcavities by a subsequent thermal annealing alone;
conducting a subsequent thermal annealing of the semiconductor material substrate at sufficiently low temperature to substantially limit diffusion of gas from the semiconductor material substrate; and
effecting the propagation of bridge fracture to sever the thin film layer from the remaining portion of the semiconductor material substrate through the application of an additional mechanical force.

22. The method of claim 21, further comprising bonding a second substrate to the face of the semiconductor material substrate.

23. The method of claim 21, wherein effecting the propagation of bridge fracture comprises a process occurring simultaneously with thermal annealing of the semiconductor material substrate.

24. The method of claim 21, wherein effecting the propagation of bridge fracture comprises a process carried out after thermal annealing of the semiconductor material substrate.

25. The method of claim 21, wherein effecting the propagation of bridge fracture comprises applying mechanical force to fracture the bridges.

26. The method of claim 25, further comprising bonding a second substrate to the face of the semiconductor material substrate, wherein applying mechanical force comprises applying a shear stress to the bridges and a tensile stress between the semiconductor material substrate and the second substrate.

* * * * *

UNITED STATES PATENT AND TRADEMARK OFFICE
CERTIFICATE OF CORRECTION

PATENT NO. : 7,498,234 B2  Page 1 of 1
APPLICATION NO. : 11/327906
DATED : March 3, 2009
INVENTOR(S) : Bernard Aspar et al.

It is certified that error appears in the above-identified patent and that said Letters Patent is hereby corrected as shown below:

Column 7, claim 6, line 17, after "mechanical force applied to" insert --the--.

Signed and Sealed this

Fifteenth Day of June, 2010

David J. Kappos
*Director of the United States Patent and Trademark Office*